(12) United States Patent
Huang et al.

(10) Patent No.: US 7,186,640 B2
(45) Date of Patent: Mar. 6, 2007

(54) SILICON-RICH OXIDE FOR COPPER DAMASCENE INTERCONNECT INCORPORATING LOW DIELECTRIC CONSTANT DIELECTRICS

(75) Inventors: Liu Huang, Singapore (SG); John Sudijono, Singapore (SG); Simon Chooi, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/177,855

(22) Filed: Jun. 20, 2002

(65) Prior Publication Data

US 2003/0235980 A1 Dec. 25, 2003

(51) Int. Cl.
  *H01L 21/4763* (2006.01)
(52) U.S. Cl. .................. 438/622; 438/624; 438/687
(58) Field of Classification Search ............... 438/637, 438/638, 624, 625, 622, 623, 626–629, 633, 438/634, 687
See application file for complete search history.

(56) References Cited

U.S. PATENT DOCUMENTS

| | | | |
|---|---|---|---|
| 5,976,984 A | 11/1999 | Chen et al. ................. 438/700 |
| 6,133,143 A | 10/2000 | Lin et al. .................... 438/627 |
| 6,166,427 A | 12/2000 | Huang et al. ................ 257/635 |
| 6,174,797 B1 | 1/2001 | Bao et al. .................... 438/624 |
| 6,207,556 B1 | 3/2001 | Hsu .............................. 438/637 |
| 6,228,756 B1 | 5/2001 | Lee .............................. 438/619 |
| 6,475,925 B1 * | 11/2002 | Braeckelmann et al. .... 438/763 |
| 6,696,222 B2 * | 2/2004 | Hsue et al. .................. 430/313 |
| 6,696,719 B2 * | 2/2004 | Yamamoto ................... 257/306 |
| 2001/0017402 A1 * | 8/2001 | Usami .......................... 257/642 |

FOREIGN PATENT DOCUMENTS

| | | |
|---|---|---|
| EP | 1201784 | 5/2002 |
| TW | 405223 | 9/2000 |
| TW | 439188 B | 6/2001 |
| TW | 472322 | 1/2002 |
| TW | 473924 | 1/2002 |

\* cited by examiner

*Primary Examiner*—Thanhha S. Pham
(74) *Attorney, Agent, or Firm*—Saile Ackerman LLC; Stephen B. Ackerman; Stephen G. Stanton

(57) ABSTRACT

A method of fabricating at least one damascene opening comprising the following steps. A structure having at least one exposed conductive structure is provided. A dielectric barrier layer over the structure and the at least one exposed conductive structure. A lower low-k dielectric layer is formed over the dielectric barrier layer. An upper low-k dielectric layer is formed over the lower low-k dielectric layer. An SRO etch stop layer is formed between the lower low-k dielectric layer and the upper low-k dielectric layer and/or an SRO hard mask layer is formed over the upper low-k dielectric layer. At least the upper and lower low-k dielectric layers are patterned to form the at least one damascene opening exposing at least a portion of the at least one conductive structure, wherein the at least one SRO layer has a high etch selectivity relative to the lower and upper low-k dielectric layers.

36 Claims, 2 Drawing Sheets

SILICON-RICH OXIDE FOR COPPER DAMASCENE INTERCONNECT INCORPORATING LOW DIELECTRIC CONSTANT DIELECTRICS

BACKGROUND OF THE INVENTION

Currently, silicon nitride (SiN) or silicon oxynitride (SiON) liners are chosen as the etch stop layer and as hard masks for fluorine (F)-doped and carbon (C)-doped low-k dielectrics like FSG, CORAL™, BLACK DIAMOND™, SILK™, etc. in copper (Cu) single/dual damascene interconnect processes. However, it has been reported that using either SiN (having a dielectric constant of about 7.0) or SiON (having a dielectric constant of about 5.5) causes masking footing and via poisoning issues due to the interaction of photoresist with amine species. Further, the high dielectric constant (k) from SiN or SiON compensates the effect of introducing low-k material into semiconductor manufacturing and results in a high effective dielectric constant of intermetal dielectric (IMD) layers.

U.S. Pat. No. 6,207,556 B1 to Hsu describes an silicon-rich oxide (SRO) layer 204 and low-k layers.

U.S. Pat. No. 6,174,797 B1 to Bao et al. describes an SRO barrier layer 16.

U.S. Pat. No. 6,228,756 B1 to Lee describes a silicon-rich layer 114 for low-k layer 106.

U.S. Pat. No. 6,166,427 to Huang et al., U.S. Pat. No. 6,133,143 to Lin et al. and U.S. Pat. No. 5,976,984 to Chen et al. describe SRO layers in interconnect processes.

SUMMARY OF THE INVENTION

Accordingly, it is an object of one or more embodiments of the present invention to provide an improved method of fabricating a damascene structure using an intermediate SRO etch stop layer and/or an uppermost SRO hard mask layer.

Other objects will appear hereinafter.

It has now been discovered that the above and other objects of the present invention may be accomplished in the following manner. Specifically, a structure having at least one exposed conductive structure is provided. A dielectric barrier layer over the structure and the at least one exposed conductive structure. A lower low-k dielectric layer is formed over the dielectric barrier layer. An upper low-k dielectric layer is formed over the lower low-k dielectric layer. An SRO etch stop layer is formed between the lower low-k dielectric layer and the upper low-k dielectric layer and/or an SRO hard mask layer is formed over the upper low-k dielectric layer. At least the upper and lower low-k dielectric layers are patterned to form the at least one damascene opening exposing at least a portion of the at least one conductive structure, wherein the at least one SRO layer has a high etch selectivity relative to the lower and upper low-k dielectric layers.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Initial Structure

Figure 1:
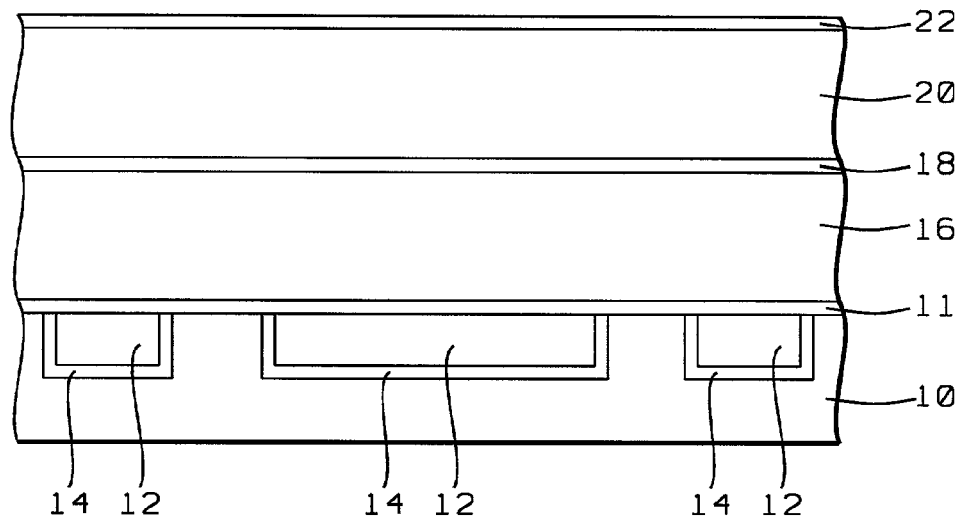
FIGS. 1 to 3 schematically illustrate in cross-sectional representation a preferred embodiment of the present invention.

FIG. 1 illustrates a cross-sectional view of a structure 10 having exposed conductive structures 12 formed therein. Conductive structures 12 may be metal plugs or lines, for example, and may include respective metal barrier layers 14 as shown in the figures. Conductive structures 12 are preferably comprised of copper (Cu), aluminum (Al), tungsten (W) or gold (Au) and are more preferably comprised of copper.

Structure 10 is preferably a silicon substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

A dielectric barrier layer 11 is formed over the structure 10 and conductive structures 12 to a thickness of preferably from about 200 to 700 Å and more preferably from about 300 to 500 Å. Dielectric barrier layer 11 is preferably comprised of SiN, SiON or SiC.

A lower dielectric layer 16 is formed over dielectric barrier layer 11 to a thickness of preferably from about 1500 to 6000 Å and more preferably from about 2500 to 5000 Å. Lower dielectric layer 16 is generally an intermetal dielectric (IMD) layer.

Lower dielectric layer 16 is preferably comprised of a low-k dielectric material such as: inorganic low-k dielectrics such as hydrogen silsesquioxane; fluorine (F)-doped or carbon (C)-doped low-k dielectric materials such as FSG, CORAL™ manufactured by NVLS; BLACK DIAMOND™ manufactured by AMAT; or SILK™ manufactured by Dow Chemical, or other organic low-k materials, for example.

Formation of SRO Etch Stop Layer 18

A silicon-rich (SRO) etch stop layer 18 is formed over the lower dielectric layer 16 to a thickness of preferably from about 200 to 1000 Å and more preferably from about 300 to 700 Å. SRO etch stop layer 18 will be used as an etch stop for the trench opening in a dual damascene interconnect (and not for the via opening etching).

SRO etch stop layer 18 is preferably formed in an amine-free environment either:

(1) by the reaction of TEOS with O2 using a plasma enhanced chemical vapor deposition (PECVD) tool under the following conditions:

TEOS gas flow: preferably from about 50 to 2000 mgm and more preferably from about 100 to 1500 mgm;

$O_2$ gas flow: preferably from about 50 to 2000 sccm and more preferably from about 100 to 1500 sccm;

He gas flow: preferably from about 100 to 5000 sccm and more preferably from about 500 to 3000 sccm;

pressure: preferably from about 2 to 15 Torr and more preferably from about 4 to 7 Torr;

temperature: preferably from about 300 to 450° C. and more preferably from about 350 to 400° C.;

HF RF power; preferably from about 100 to 1200 W and more preferably from about 200 to 700 W; and LF RF power; preferably from about 50 to 1000 W and more preferably from about 70 to 500 W;

or (2) by the reaction of $SiH_4$ with $O_2$ using a high density plasma chemical vapor deposition (HDP CVD) tool under the following conditions:
  $SiH_4$ gas flow: preferably from about 20 to 100 sccm and more preferably from about 30 to 50 sccm;
  $O_2$ gas flow: preferably from about 30 to 150 sccm and more preferably from about 40 to 80 sccm;
  $SiH_4$:$O_2$ ratio: preferably from about 1:2 to 1:1 and more preferably about 1:1.5;
  pressure: preferably from about 2 to 7 mTorr and more preferably from about 3 to 6 mTorr;
  temperature: preferably from about 250 to 500° C. and more preferably from about 300 to 400° C.;
  LF RF power; preferably from about 2000 to 5000 W and more preferably from about 2500 to 4500 W; and
  bias RF power; preferably from about 0 to 2000 W and more preferably from about 0 to 1000 W.

SRO etch stop layer 18 has a refractive index (RI) of preferably from about 1.52 to 1.75, a dielectric constant (k) of from about 4.0 to 4.2. The Si-rich properties of SRO etch stop layer 18 provide for a much higher film density and greater hardness than other low-k materials which results in a high etch selectivity between SRO etch stop layer 18 and other low-k materials such as lower low-k dielectric layer 16 and upper low-k dielectric layer 20 (see below).

An upper dielectric layer 20 is formed over SRO etch stop layer 18 to a thickness of preferably from about 2000 to 8000 Å and more preferably from about 3000 to 6000 Å. Upper dielectric layer 20 is generally also an intermetal dielectric (IMD) layer.

Upper dielectric layer 20 is preferably comprised of a low-k dielectric material such as: inorganic low-k dielectrics such as hydrogen silsesquioxane; fluorine (F)-doped or carbon (C)-doped low-k dielectric materials such as FSG, CORAL™ manufactured by NVLS; BLACK DIAMOND™ manufactured by AMAT; SILK™ manufactured by Dow Chemical or organic low-k materials, for example.

Formation of SRO Hard Mask Layer 22

A silicon-rich (SRO) hard mask layer 22 is formed over the upper dielectric layer 20 to a thickness of preferably from about 200 to 1000 Å and more preferably from about 300 to 700 Å.

SRO hard mask layer 22 is preferably formed in an amine-free environment by either:
(1) the reaction of TEOS with $O_2$ using a plasma enhanced chemical vapor deposition (PE CVD) tool under the following conditions:
  TEOS gas flow: preferably from about 50 to 2000 mgm and more preferably from about 100 to 1500 mgm;
  $O_2$ gas flow: preferably from about 50 to 2000 sccm and more preferably from about 100 to 1500 sccm;
  He gas flow: preferably from about 100 to 5000 sccm and more preferably from about 500 to 3000 sccm;
  pressure: preferably from about 2 to 15 Torr and more preferably from about 4 to 7 Torr;
  temperature: preferably from about 300 to 450° C. and more preferably from about 350 to 400° C.;
  HF RF power: preferably from about 100 to 1200 W and more preferably from about 200 to 700 W; and
  LF RF power: preferably from about 50 to 1000 W and more preferably from about 70 to 500 W;
or
(2) the reaction of $SiH_4$ with $O_2$ using a high density plasma chemical vapor deposition (HDP CVD) tool under the following conditions:
  $SiH_4$ gas flow: preferably from about 20 to 100 sccm and more preferably from about 30 to 50 sccm;
  $O_2$ gas flow: preferably from about 30 to 150 sccm and more preferably from about 40 to 80 sccm;
  $SiH_4$:$O_2$ ratio: preferably from about 1:2 to 1:1 and more preferably about 1:1.5;
  pressure: preferably from about 2 to 7 mTorr and more preferably from about 3 to 6 mTorr;
  temperature: preferably from about 250 to 400° C. and more preferably from about 300 to 350° C.;
  LF RF power; preferably from about 2000 to 5000 W; and more preferably from about 2500 to 4500 W; and
  bias RF power; preferably from about 0 to 2000 W; and more preferably from about 0 to 1200 W.

SRO hard mask layer 22 has a refractive index (RI) of preferably from about 1.52 to 1.75, a dielectric constant (k) of from about 4.0 to 4.2. The Si-rich properties of SRO hard mask layer 22 provide for a much higher film density and greater hardness than other low-k materials which results in a high etch selectivity between SRO hard mask layer 22 and other low-k materials such as upper low-k dielectric layer 20.

It is noted that under the teachings of the present invention, (1) just an SRO etch stop layer 18 may be formed for dual damascene interconnect formation, (2) just an SRO hard mask layer 22 may be formed; or (3) both an SRO etch stop layer 18 and an SRO hard mask layer 22 may be formed for dual damascene interconnect formation as shown in the figures.

Patterning of Upper and Lower Dielectric Layers 20, 16

Figure 2:
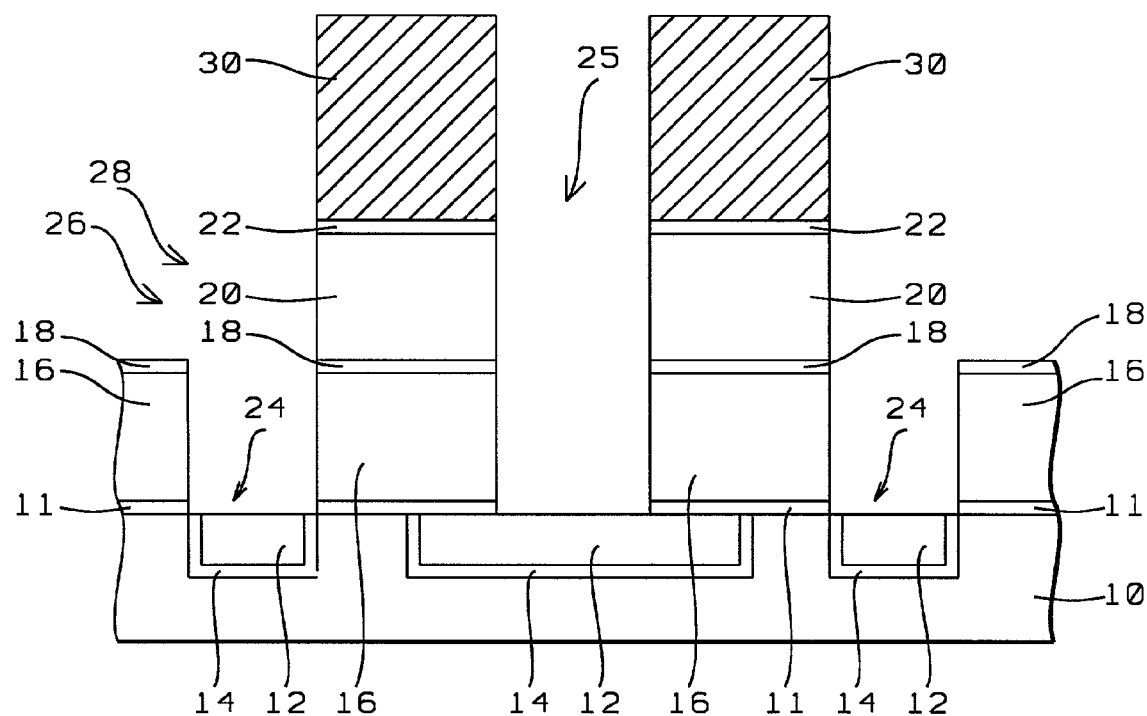
Figure 3:
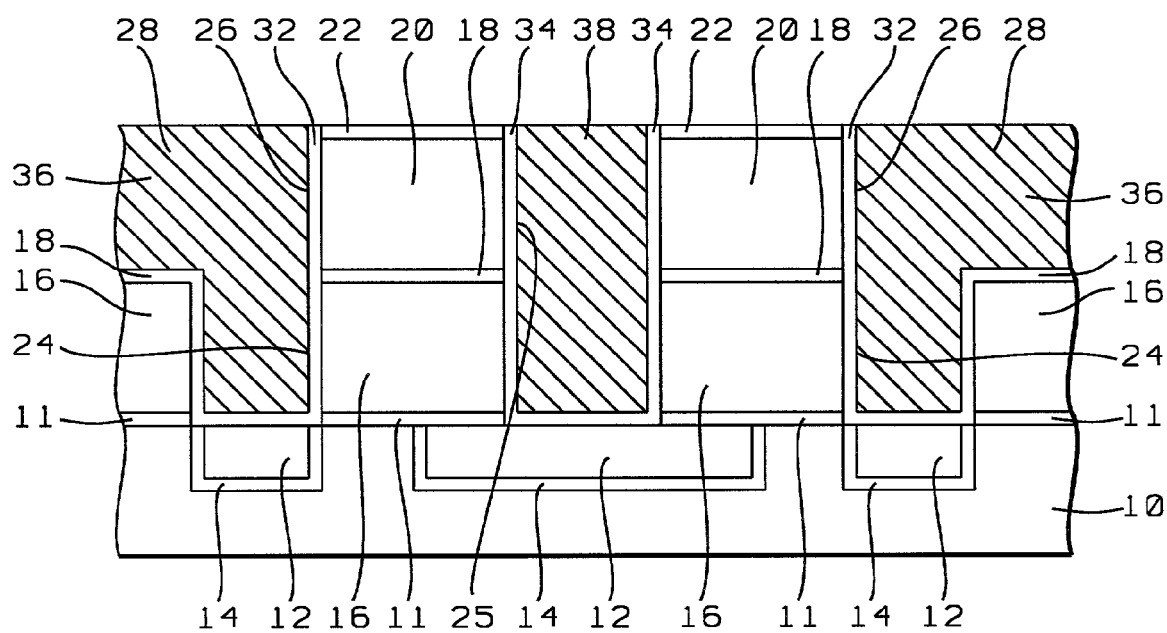

As shown in FIG. 2, the upper and lower dielectric layers 20, 16 are patterned to form for example, via openings 24, 25 and trench openings 26 (only partially shown in FIGS. 2 and 3) where via openings 24 and the respective trench openings 26 comprise dual damascene openings 28 (again, only partially shown in FIGS. 2 and 3). In the formation of dual damascene openings 28, SRO etch stop layer 18 is used as an etch stop layer only in the formation of trench openings 26.

As shown in FIG. 2, the upper and lower dielectric layers 20, 16 may be patterned using patterned photoresist layer, for example.

Dielectric barrier layer 11 is also patterned to expose at least a portion of conductive structures 12 as shown in FIG. 2.

For example, central via opening 25 is formed through the upper and lower dielectric layers 20, 16. If only via openings 25 were formed, then SRO etch stop layer 18 could be omitted, hence upper and lower dielectric layers 20, 16 could be a single dielectric layer with an overlying SRO hard mask layer 22. Via openings 25 need not be formed central to other openings, such as dual damascene openings 28, and may be the only opening formed, just as dual damascene openings 28 need not be formed distal to any central via opening 25 and may be the only openings formed.

Formation of Planarized Dual Damascene Structures 36 and Via Structures 38

As shown in FIG. 3, photoresist layer 30 is removed as necessary, and: planarized metal dual damascene structures 36 are formed within dual damascene openings 28; and a planarized via structure, or plug, 38 is formed within central via opening 25 by methods and processes known in the art. Barrier metal layers 32 may be first formed within the dual damascene openings 28 and barrier metal layer 34 may be first formed within the central via opening 25 as shown in FIG. 3.

Planarized metal structures 36, 38 are preferably comprised of copper (Cu), aluminum (Al), tungsten (W) or gold (Au) and are more preferably comprised of copper.

Advantages of the Invention

The advantages of one or more embodiments of the present invention include:
1) formation of damascene structures without masking footing or via poisoning issues;
2) reduction of the effective dielectric constant (k) of inter-metal dielectric (IMD) layers;
3) the SRO layers 18, 22 block the moisture absorption by FSG or low-k dielectric films such as IMD layers;
4) the SRO layers 18, 22 block outgassing from FSG or low-k dielectric films such as IMD layers; and
5) the SRO layers 18, 22 establish a sufficiently high etch selectivity as to FSG or low-k dielectric films such as IMD layers.

While particular embodiments of the present invention have been illustrated and described, it is not intended to limit the invention, except as defined by the following claims.

We claim:

1. A method of fabricating at least one damascene opening, comprising steps of:
   providing a structure having at least one exposed conductive structure;
   forming a dielectric barrier layer over the structure and the at least one exposed conductive structure;
   forming a lower low-k dielectric layer over the dielectric barrier layer;
   the upper low-k dielectric layer being distinct and comprised of different material to the lower low-k dielectric layer;
   forming an SRO (silicon-rich oxide) hard mask layer on and directly contacting the upper low-k dielectric layer by either a) a reaction of TEOS with $O_2$ using a PE CVD tool; or b) a reaction of $SiH_4$ with $O_2$ using an HDP CVD tool; and
   patterning at least the upper and lower low-k dielectric layers and the dielectric barrier layer to form the at least one damascene opening exposing at least a portion of the at least one exposed conductive structure, wherein the at least one SRO (silicon-rich oxide) hard mask layer has a high etch selectivity relative to the lower and upper low-k dielectric layers.

2. The method of claim 1, wherein the structure is a semiconductor substrate; the at least one exposed conductive structure is comprised of Cu, Al, W or Au; and the lower and upper low-k dielectric layers are formed of inorganic low-k materials, F-doped low-k materials, C-doped low-k materials or organic low-k materials.

3. The method of claim 1, wherein the structure is a semiconductor silicon substrate; the at least one exposed conductive structure is comprised of Cu; and the lower and upper low-k dielectric layers are formed of F-doped low-k materials, C-doped low-k materials or organic low-k materials.

4. The method of claim 1, wherein the dielectric barrier layer is from about 200 to 700 Å thick, the lower low-k dielectric layer is from about 1500 to 6000 Å thick, the upper low-k dielectric layer is from about 2000 to 8000 Å thick and the SRO hard mask layer formed is from about 200 to 1000 Å thick.

5. The method of claim 1, wherein the dielectric barrier layer is from about 300 to 500 Å thick, the lower low-k dielectric layer is from about 2500 to 5000 Å thick, the upper low-k dielectric layer is from about 3000 to 6000 Å thick, and the SRO hard mask layer formed is from about 300 to 700 Å thick.

6. The method of claim 1, wherein the SRO hard mask layer is formed under the following conditions using the PE CVD tool:
   TEOS gas flow: from about 50 to 2000 mgm;
   $O_2$ gas flow: from about 50 to 2000 sccm;
   He gas flow: from about 100 to 5000 sccm;
   pressure: from about 2 to 15 Torr;
   temperature: from about 300 to 450° C.;
   HF RF power: from about 100 to 1200 W; and
   LF RF power: from about 50 to 1000 W.

7. The method of claim 1, wherein the SRO hard mask layer is formed under the following conditions using the PE CVD tool:
   TEOS gas flow: from about 100 to 1500 mgm;
   $O_2$ gas flow: from about 100 to 1500 sccm;
   He gas flow: from about 500 to 3000 sccm;
   pressure: from about 4 to 7 Torr;
   temperature: from about 350 to 400° C.;
   HF RF power: from about 200 to 700 W; and
   LF RF power: from about 70 to 500 W.

8. The method of claim 1, wherein the dielectric barrier layer is comprised of SiN, SiON or SiC.

9. The method of claim 1, wherein the SRO hard mask layer formed has a refractive index of from about 1.52 to 1.75.

10. The method of claim 1, wherein the SRO (silicon-rich oxide) hard mask layer does not have C or F.

11. The method of claim 1, wherein the SRO hard mask layer is formed under the following conditions using the HDP CVD tool:
    $SiH_4$ gas flow: from about 20 to 100 sccm;
    $O_2$ gas flow: from about 30 to 150 sccm;
    $SiH_4$:$O_2$ ratio: from about 1:2 to 1:1;
    pressure: from about 2 to 7 mTorr;
    temperature: from about 250 to 500° C.;
    LF RF power, from about 2000 to 5000 W; and
    bias RF power, from about 0 to 2000 W.

12. The method of claim 1, wherein the SRO hard mask layer formed is formed under the following conditions using the HDP CVD tool:
    $SiH_4$ gas flow: from about 30 to 50 sccm;
    $O_2$ gas flow: from about 40 to 80 sccm;
    $SiH_4$:$O_2$ ratio: about 1:1.5;
    pressure: from about 3 to 6 mTorr;
    temperature: from about 300 to 400° C.;
    LF RF power, from about 2500 to 4500 W; and
    bias RF power, from about 0 to 1000 W.

13. A method of fabricating at least one damascene opening, comprising steps of:
    providing a structure having at least one exposed conductive structure;
    forming a dielectric barrier layer over the structure and the at least one exposed conductive structure;
    forming a lower low-k dielectric layer over the dielectric barrier layer; forming an SRO (silicon-rich oxide) etch stop layer over the lower low-k dielectric layer by a) a reaction of TEOS with $O_2$ using a PE CVD tool; or b) a reaction of $SiH_4$ with $O_2$ using an HDP CVD tool;
    forming an upper low-k dielectric layer over the SRO (silicon-rich oxide) etch stop layer;
    forming an SRO (silicon-rich oxide) hard mask layer on and directly contacting the upper low-k dielectric layer by a) the reaction of TEOS with $O_2$ using the PE CVD tool; or b) the reaction of $SiH_4$ with $O_2$ using an HDP CVD tool; and patterning at least the upper and lower low-k dielectric layers to form the at least one damascene opening exposing at least a portion of the at least one exposed conductive structure, wherein the SRO (silicon-rich oxide) etch stop layer and the SRO (silicon-rich oxide) hard mask each have a high etch selectivity relative to the lower and upper low-k dielectric layers.

14. The method of claim 13, wherein the structure is a semiconductor substrate; the at least one exposed conductive structure is comprised of Cu, Al, W or Au; and the lower and upper low-k dielectric layers are formed of inorganic low-k materials, F-doped low-k materials, C-doped low-k materials or organic low-k materials.

15. The method of claim 13, wherein the structure is a semiconductor silicon substrate; the at least one exposed conductive structure is comprised of Cu; and the lower and upper low-k dielectric layers are formed of F-doped low-k materials, C-doped low-k materials or organic low-k materials.

16. The method of claim 13, wherein the dielectric barrier layer is from about 200 to 700 Å thick, the lower low-k dielectric layer is from about 1500 to 6000 Å thick, the upper low-k dielectric layer is from about 2000 to 8000 Å thick, the SRO etch stop layer is from about 200 to 1000 Å thick and the SRO hard mask layer is from about 200 to 1000 Å thick.

17. The method of claim 13, wherein the dielectric barrier layer is from about 300 to 500 Å thick, the lower low-k dielectric layer is from about 2500 to 5000 Å thick, the upper low-k dielectric layer is from about 3000 to 6000 Å thick, the SRO etch stop layer is from about 300 to 700 Å thick and the SRO hard mask layer is from about 300 to 700 Å thick.

18. The method of claim 13, wherein the SRO etch stop layer and the SRO hard mask layer are each formed under the following conditions using the PE CVD tool:
TEOS gas flow: from about 50 to 2000 mgm;
$O_2$ gas flow: from about 50 to 2000 sccm;
He gas flow: from about 100 to 5000 sccm;
pressure: from about 2 to 15 Torr;
temperature: from about 300 to 450° C.;
HF RF power: from about 100 to 1200 W; and
LF RF power: from about 50 to 1000 W.

19. The method of claim 13, wherein the SRO etch stop layer and the SRO hard mask layer are each formed under the following conditions using the PE CVD tool:
TEOS gas flow: from about 100 to 1500 mgm;
$O_2$ gas flow: from about 100 to 1500 sccm;
He gas flow: from about 500 to 3000 sccm;
pressure: from about 4 to 7 Torr;
temperature: from about 350 to 400° C.;
HF RF power: from about 200 to 700 W; and
LF RF power: from about 70 to 500 W.

20. The method of claim 13, wherein the SRO etch stop layer and the SRO hard mask layer have an refractive index of from about 1.52 to 1.75.

21. The method of 13, wherein the SRO (silicon-rich oxide) etch stop layer and the SRO (silicon-rich oxide) hard mask layer each do not have C or F.

22. The method of claim 13, wherein the SRO etch stop layer-and the SRO hard mask layer are each formed under the following conditions using the HDP CVD tool:
$SiH_4$ gas flow: from about 20 to 100 sccm;
$O_2$ gas flow: from about 30 to 150 sccm;
$SiH_4$: from about 30 to 150 sccm;
$SiH_4$:$O_2$ from about 1:2 to 1:1;
pressure: from about 2 to 7 mTorr;
temperature: from about 250 to 500° C.;
LF RF power, from about 2000 to 5000 W; and
bias RF power, from about 0 to 2000 W.

23. The method of claim 13, wherein the SRO etch stop layer and the SRO hard mask layer are each formed under the following conditions using the HDP CVD tool:
$SiH_4$ gas flow: from about 30 to 50 sccm;
$O_2$ gas flow: from about 40 to 80 sccm;
$SiH_4$:$O_2$ ratio: about 1:1.5;
pressure: from about 3 to 6 mTorr;
temperature: from about 300 to 400° C.;
LF RF power, from about 2500 to 4500 W; and
bias RF power, from about 0 to 1000 W.

24. A method of fabricating at least one damascene opening, comprising steps of:

providing a semiconductor substrate having at least one exposed copper structure;

forming a dielectric barrier layer over the semiconductor substrate and the at least one exposed copper structure;

forming a lower low-k dielectric layer over the dielectric barrier layer;

forming an SRO (silicon-rich oxide) etch stop layer over the lower low-k dielectric layer wherein the SRO (silicon-rich oxide) etch stop layer being formed by a) a reaction of TEOS with $O_2$ using a PE CVD tool; or b) a reaction of $SiH_4$ with $O_2$ using an HDP CVD tool;

forming an upper low-k dielectric layer over the SRO (silicon-rich oxide) etch stop layer;

forming an SRO (silicon-rich oxide) hard mask layer on and directly contacting the upper low-k dielectric layer wherein the SRO (silicon-rich oxide) hard mask layer being formed by a) the reaction of TEOS with $O_2$ using the PE CVD tool; or b) the reaction of $SiH_4$ with $O_2$ using the HDP CVD tool; and patterning at least the upper and lower low-k dielectric layers to form the at least one damascene opening exposing at least a portion of the at least one exposed copper structure, wherein the SRO (silicon-rich oxide) etch stop layer and the SRO (silicon-rich oxide) hard mask each have a high etch selectivity relative to the lower and upper low-k dielectric layers.

25. The method of claim 24, wherein the lower and upper low-k dielectric layers are formed of inorganic low-k materials, F-doped low-k materials, C-doped low-k materials or organic low-k materials.

26. The method of claim 24, wherein the dielectric barrier layer is from about 200 to 700 Å thick, the lower low-k dielectric layer is from about 1500 to 6000 Å thick, the upper low-k dielectric layer is from about 2000 to 8000 Å thick, the SRO etch stop layer is from about 200 to 1000 Å thick and the SRO hard mask layer is from about 200 to 1000 Å thick.

27. The method of claim 24, wherein the dielectric barrier layer is from about 300 to 500 Å thick, the lower low-k dielectric layer is from about 2500 to 5000 Å thick, the upper low-k dielectric layer is from about 3000 to 6000 Å thick, the SRO etch stop layer is from about 300 to 700 Å thick and the SRO hard mask layer is from about 300 to 700 Å thick.

28. The method of claim 24, wherein the SRO etch stop layer and the SRO hard mask layer are each formed under the following conditions using the PE CVD tool:
TEOS gas flow: from about 50 to 2000 mgm;
$O_2$ gas flow: from about 50 to 2000 sccm;
He gas flow: from about 100 to 5000 sccm;
pressure: from about 2 to 15 Torr;

temperature: from about 300 to 450° C.;
HF RF power: from about 100 to 1200 W; and
LE RF power: from about 50 to 1000 W.

29. The method of claim 24, wherein the SRO etch stop layer and the SRO hard mask layer are each formed under the following conditions using the PE CVD tool:
TEOS gas flow: from about 100 to 1500 mgm;
$O_2$ gas flow: from about 100 to 1500 sccm;
He gas flow: from about 500 to 3000 sccm;
pressure: from about 4 to 7 Torr;
temperature: from about 350 to 400° C.;
HF RF power: from about 200 to 700 W; and
LF RE power: from about 70 to 500 W.

30. The method of claim 24, wherein the SRO etch stop layer and the SRO hard mask layer have a refractive index of from about 1.52 to 1.75.

31. The method of claim 24, including a step of forming at least one planarized metal damascene structure within the at least one damascene opening.

32. The method of claim 24, including a step of forming at least one planarized copper damascene structure within the at least one damascene opening.

33. The method of claim 24, wherein the at least one damascene opening is a dual damascene opening; and including a step of forming at least one planarized metal dual damascene structure within the at least one dual damascene opening.

34. The method of claim 24, wherein the SRO (silicon-rich oxide) etch stop layer and the SRO (silicon-rich oxide) hard mask layer each do not have C or F.

35. The method of claim 24, wherein the SRO etch stop layer and the SRO hard mask layer are each formed under the following conditions using the HDP CVD tool:
$SiH_4$ gas flow: from about 20 to 100 sccm;
$O_2$ gas flow: from about 30 to 150 sccm;
$SiH_4:O_2$ ratio: from about 1:2 to 1:1;
pressure: from about 2 to 7 mTorr;
temperature: from about 250 to 500° C.;
LF RF power, from about 2000 to 5000 W; and
bias RF power, from about 0 to 2000 W.

36. The method of claim 24, wherein the SRO etch stop layer and the SRO hard mask layer are each formed under the following conditions using the HDP CVD tool:
$SiH_4$ gas flow: from about 30 to 50 sccm;
$O_2$ gas flow: from about 40 to 80 sccm;
$SiH_4:O_2$ ratio: about 1:15;
pressure: from about 3 to 6 mTorr;
temperature: from about 300 to 400° C.;
LF RF power, from about 2500 to 4500 W; and
bias RF power, from about 0 to 1000 W.

* * * * *